United States Patent [19]

Wu et al.

[11] Patent Number: 5,240,736
[45] Date of Patent: Aug. 31, 1993

[54] METHOD AND APPARATUS FOR IN-SITU MEASURING FILAMENT TEMPERATURE AND THE THICKNESS OF A DIAMOND FILM

[75] Inventors: Ching-Hsong Wu, Farmington Hills; Timothy J. Potter, Dearborn, both of Mich.; Michael A. Tamor, Toledo, Ohio

[73] Assignee: Ford Motor Company, Dearborn, Mich.

[21] Appl. No.: 966,957

[22] Filed: Oct. 26, 1992

[51] Int. Cl.$^5$ ................... C23C 16/26; C23C 16/46; C23C 16/48; C23C 16/52
[52] U.S. Cl. ..................... 427/10; 427/566; 427/577; 427/592; 427/249; 118/666; 118/708; 118/712; 118/715; 118/722; 118/725
[58] Field of Search ............... 427/10, 566, 592, 577, 427/249; 118/666, 708, 712, 715, 722, 725

[56] References Cited

U.S. PATENT DOCUMENTS

| | | | |
|---|---|---|---|
| 4,024,291 | 5/1977 | Wilmanns | 427/10 |
| 4,311,725 | 1/1982 | Holland | 427/10 |
| 4,525,376 | 6/1985 | Edgerton | 427/10 |
| 4,711,790 | 12/1987 | Morishige | 427/10 |
| 4,888,199 | 12/1989 | Felts et al. | 427/10 |
| 4,897,281 | 1/1990 | Arai et al. | 427/8 |
| 4,959,244 | 9/1990 | Penney et al. | 427/53.1 |
| 5,099,788 | 3/1992 | Ito et al. | 118/666 |

OTHER PUBLICATIONS

"Light Guide Radiation Pyrometry", by J. Vollmer, et al, Journal of the Optical Society of America, vol. 49, No. 1, Jan. 1959, pp. 75-77.
"Radiation Pyrometry and its Underlying Principles of Radiant Heat Transfer", by Thomas R. Harrison, Jan. 1960, pp. 3-7.
"Characterization of Ion Beam-Induced Surface Modification of Diamond Films by Real Time Spectroscopic Ellipsometry", by Yue Cong, et al., J. Vac. Sci. Technol. A9(3), May/Jun. 1991, pp. 1123-1128.

*Primary Examiner*—Richard Bueker
*Attorney, Agent, or Firm*—Roger L. May; Joseph W. Malleck

[57] ABSTRACT

Provided is a method and apparatus for in-situ measuring filament temperature and the thickness of a film deposited on a substrate disposed within a hot-filament chemical vapor deposition reactor. In accordance with the invention, white light which is emitted directly from the filament and that reflects from the top and bottom surfaces of a deposited film are collected and converted to monochromatic light through the use of simple narrow-banned interference filters operative over specific, yet different, optical banned widths. This information is thereafter used to mathematically calculate the filament temperature, film thickness and growth rate of the deposited film.

21 Claims, 2 Drawing Sheets

METHOD AND APPARATUS FOR IN-SITU MEASURING FILAMENT TEMPERATURE AND THE THICKNESS OF A DIAMOND FILM

TECHNICAL FIELD

This invention relates generally to the measurement of deposition parameters during film growth in a hot-filament chemical vapor deposition reactor. More particularly, this invention relates to an apparatus and method for in-situ measuring filament temperature and the thickness of a film deposited on a substrate disposed within a hot-filament chemical vapor deposition reactor.

BACKGROUND ART

Hot-filament chemical vapor deposition (HFCVD) constitutes one of the most viable techniques in low pressure diamond film fabrication. To improve the quality and yield of CVD diamond films, it is desirable to measure a variety of key deposition parameters during film growth, including filament temperature and film growth rate. Filament temperature is known to affect the chemical composition of the deposited gas which, in turn, affects the film quality and yield. The growth rate of the deposited film also corresponds to the resultant film thickness which must be varied according to the desired application.

Various methods have been proposed for the measurement of filament temperature alone through the use of a pyrometer which determines the subject temperature based upon radiation emissivity. Prior to the Applicants' invention, however, no suitable technique has been disclosed for the concurrent in-situ monitoring and measurement of filament temperature and film thickness. Indeed, those skilled in the art will recognize that the harsh environment in which diamond films are typically grown has heretofore inhibited such processes.

U.S. Pat. No. 4,711,790 to Morishige, for example, discloses a device for monitoring the thickness and peak temperature of thick films grown onto a substrate during chemical vapor deposition. In operation, a pulsed optical beam emitted from an optical source is directed onto a predetermined area of a substrate where a thin film is to be deposited. A temperature monitoring unit is disclosed for receiving an infrared beam emitted from a heated CVD film during deposition. There is further disclosed a control unit for controlling the temperature monitoring unit to vary the temperature of the CVD film to a predetermined peak temperature. As disclosed by Morishige, the CVD film begins to partially deteriorate when the CVD film passes this peak temperature. Because the heat capacity of the CVD film is proportional to its thickness, a deterioration of the CVD film causes the film to fall past peak temperature. A temperature fall past peak temperature provides an indication that the CVD film has grown to the desired thickness. The control unit is therefore used to vary the intensity of the pulsed optical beam to maintain the peak temperature of the CVD film to within an optimum temperature range.

U.S. Pat. No. 4,024,291 issued to Wilmanns discloses a method for optically monitoring and regulating the thickness of a vapor deposited layer formed onto a silicone substrate. Wilmanns discloses the commonly known spectroscopic technique which entails using a photoreceiver to collect, and then transform into electrical output signals, light beams reflected off of the surface of a CVD layer. The electrical signals are passed through two differentiating units and then further processed to determine the build up of the CVD layers on the substrate.

U.S. Pat. No. 4,331,725 issued to Holland discloses a method for controlling the deposition of thin films onto a substrate by measuring the optical reflectance or transmittance from a deposited film. As disclosed by Holland, during the measurement process, a pair of monitors comprising light detectors collect and measure light reflected from a film being deposited onto a substrate. The reflected light is transformed into an electrical signal having magnitude corresponding to the reflectance or transmittance of the film being deposited onto the substrate. Holland further discloses a microprocessor for calculating the quotient between the electrical signal and a signal corresponding to the reflectants or transmittants from a film being deposited onto a separate quartz crystal. Significantly, the crystal is assumed to be subject to vapor deposition of the same material and at the same rate. Those skilled in the art will recognize, however, that such crystals are not suited to the high temperatures typical of CVD diamond deposition.

U.S. Pat. No. 4,525,376 issued to Edgerton, discloses a method for continuously controlling the thickness of a layer of material deposited onto a substrate through the use of an optical detector disposed inside of a glow discharge chamber. The complex system disclosed by Edgerton requires an optical detector, i.e. an optical pyrometer, for measuring light reflected from thin films of material being deposited onto a substrate. In operation, the thickness of the layer being deposited onto a substrate is determined by comparing the intensity of the reflected beam as a function of wave length with that of an incident beam being directed towards the substrate from an external light source.

U.S. Pat. No. 4,959,244 issued to Penney, et al discloses a method for measuring temperature of CVD films deposited on a workpiece. A complicated temperature measuring system is disclosed which collects radiation emitted from the workpiece surface which, in turn, is passed through a spectrometer. The spectrometer is used to detect shorter wave length light toward the blue edge of the spectrum for determining a surface temperature signal. The detector system disclosed by Penney consists of a prism, focusing optics, an intensified linear array detector, and a photon counting device.

Significantly, none of the prior art references teach or suggest Applicants' method or apparatus for concurrent in-situ monitoring and control of filament temperature and film thickness. Such measurement and control is of critical importance to the operator during hot filament chemical vapor deposition of diamond films. In each of the references disclosed above, the monitoring of film thickness also requires an additional light source such as a laser or white light, which is obviated by Applicants' design.

SUMMARY OF THE INVENTION

The invention of Applicants discloses a simple and inexpensive method and apparatus for the concurrent in-situ monitoring of both filament temperature and the thickness of a film deposited on a substrate disposed within a hot-filament chemical vapor deposition reactor. Generally, Applicants disclose the use of a single optical thermometer coupled with a lightpipe which obviates the need for focusing optics and an external light source.

In operation, white light emitted directly from the filament and that reflected from the top and bottom surfaces of the deposited film are collected and converted to monochromatic light through the use of simple narrow-band interference filters operative over specific, yet different optical bandwidths. This information is thereafter used to mathematically calculate the filament temperature and film thickness.

It is therefore a general object of the present invention to provide a simple, inexpensive method and apparatus for the concurrent in-situ measurement of filament temperature and film thickness or growth rate.

A more specific object of the present invention is the provision of a simple and inexpensive method and apparatus for the measurement and control of filament temperature and diamond film thickness in a hot-filament chemical vapor deposition reactor.

In accordance with the apparatus disclosed by Applicants herein, there is provided heating means positioned within a hot-filament chemical vapor deposition reactor for maintaining a film substrate at a selected fixed temperature. Radiation detection means is further provided for detecting radiation emitted from the filament and radiation reflected as an interference fringe from the top and bottom surfaces of the film grown on the substrate during operation of the reactor. Power supply means is also provided in electrical contact with the radiation detection means and the filament for regulating the temperature thereof.

First signal generating means is provided in electrical contact with the radiation detection means for receiving radiation over a first selected optical bandwidth and generating a first electrical signal having a current corresponding to the intensity of the detected radiation. Second signal generating means is also provided in electrical contact with the radiation detection means for receiving radiation over a second selected optical bandwidth and generating a second electrical signal having a current corresponding to the intensity of the detected radiation. Finally, signal processing means is provided in electrical contact with the first and second signal generating means for receiving and processing the first and second electrical signals to mathematically calculate the instantaneous temperature of the filament and the thickness of the film grown on the substrate during deposition.

The operation of the apparatus disclosed by Applicant is more fully described as follows. First, the film substrate must be heated to a selected fixed temperature. Thereafter, radiation emitted from the filament and radiation reflected as an interference fringe from the top and bottom surfaces of the diamond film is detected over a first selected optical bandwidth. This radiation is concurrently detected over a second selected optical bandwidth. Thereafter, first and second electrical signals are generated, each having a current corresponding to the intensity of the radiation detected over the corresponding selected optical bandwidth. The first and second electrical signals are compared to determine the ratio of the respective currents such that the filament temperature may be mathematically calculated.

Concurrently therewith, the period of interference fringe may be calculated such that the diamond film thickness (D) may be determined in accordance with the formulas $D = nP$ and $P = \lambda/2\eta$ where P is the film thickness corresponding to one period of interference fringe, $\lambda$ is the wavelength of the first or second optical bandwidths, $\eta$ is the index of refraction and n is the number of the period of interference fringes. The growth rate (R) of the deposited film may also be calculated according to the formula $$R = \frac{D}{t}$$

where t = deposition time.

If it is desired by the operator to control the filament temperature based upon the information provided, a third electrical signal may be generated corresponding to the calculated filament temperature and directed to a control means for adjusting the power means to achieve the desired chemical composition of the depositing gas.

BEST MODE FOR CARRYING OUT THE INVENTION

Figure 1:
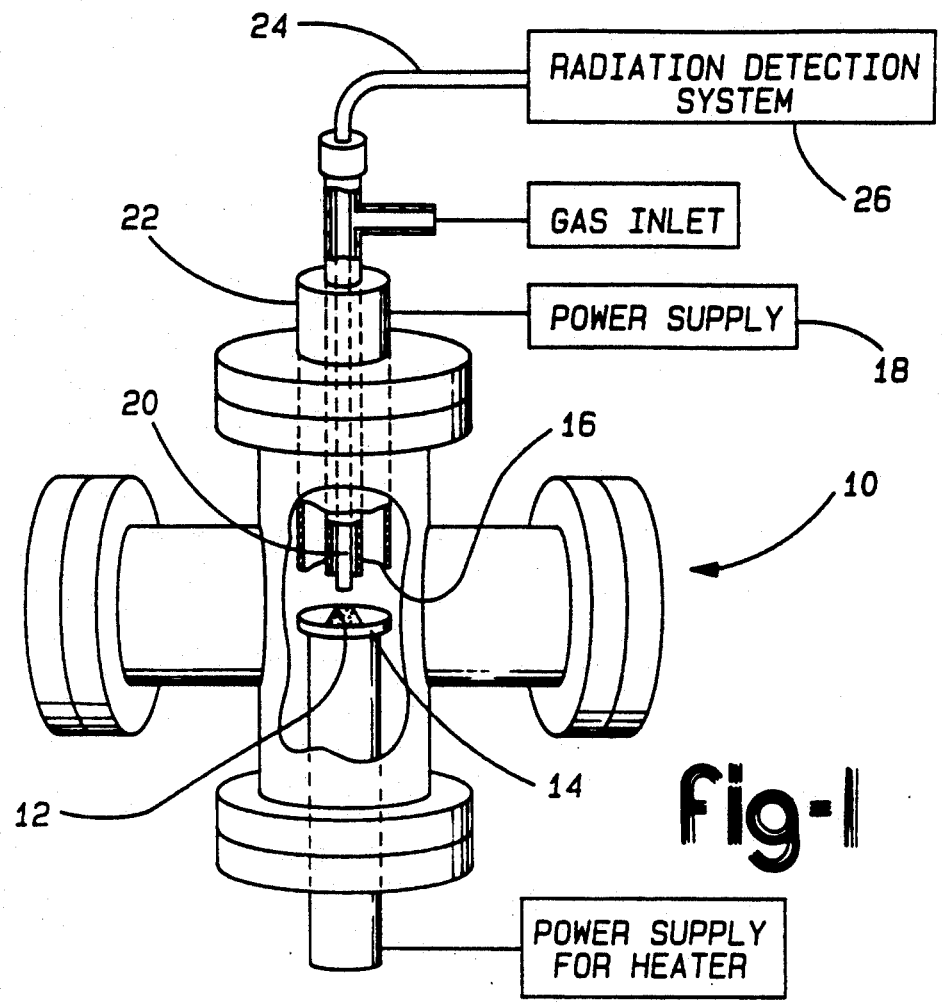
FIG. 1 is a schematic diagram of a hot-filament chemical vapor deposition reactor adapted to receive the apparatus of the present invention and shown in partial cross-section.

According to the invention described herein, there is provided a six-port hot-filament chemical vapor deposition reactor generally indicated by reference numeral 10. Reactor 10 is adapted to receive a substrate 12 which is typically a silicone (Si) wafer which, in turn, is placed on a substrate heater 14. Heater 14 is adapted to maintain substrate 12 at a selected fixed temperature.

A filament 16 is suspended substantially horizontally at a constant distance above substrate 12 such that approximately a 1 inch diameter area of substrate 12 is covered. Filament 16 is preferably a 6-pass zig-zag shape grid having a 0.006 inch diameter which has been found to draw less energy and operate efficiently without the need for external cooling for the reactor. It is recognized by Applicants, however, that other suitable shapes and size filaments may be utilized to achieve the required film deposition.

The temperature of filament 16 is regulated by an AC power supply 18 and measured by a detection system described more fully below. In its simplest form, the detection system may comprise an optical thermometer (not shown) coupled with a lightpipe sensor 20.

As seen in FIG. 1, lightpipe 20 is inserted vertically from the top flange 22 of reactor 10 to approximately 1 inch from filament grid 16 to collect radiation emitted therefrom. Lightpipe 20 is preferably 0.05 inches in diameter and 9 inches in length, however, it is recognized by Applicants that any suitable diameter and length lightpipe may be utilized depending upon the particular application.

In operation, radiant energy is transmitted via a fiberoptic cable 24 to detector system 26. In a preferred embodiment, detector system 26 consists of two diode detectors (not shown) each having a narrow band filter operable over a specific, yet different optical bandwidth.

Figure 2:
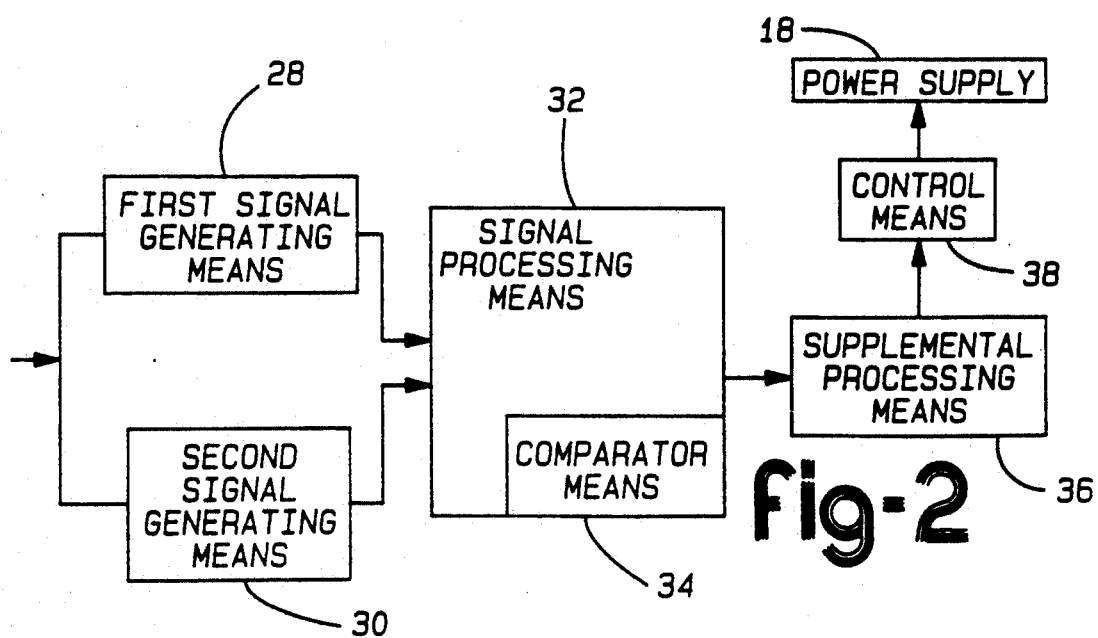
FIG. 2 is a block diagram of the detector system of the apparatus of the present invention.

With reference to FIG. 2, detector system 26 is shown in further detail. Attention is directed to first and second signal generating means 28 and 30, respectively, which are provided in electrical contact with lightpipe 20 or other suitable radiation detection means for receiving radiation detected over respective first and second selected optical bandwidths. First and second signal generating means 28 and 30 convert detected white light to monochromatic light and further generate first and second electrical signals having currents corresponding to the intensity of radiation detected over their respective optical bandwidths. Detector system 26 further includes signal processing means 32 in electrical contact with the first and second signal generating means 28 and 30 for receiving and processing the first and second electrical signals to mathematically calculate the instantaneous temperature of the filament and the thickness of the diamond film grown on substrate 12.

Those skilled in the art will recognize that the signal processing means 32 must, by design, also include comparator means 34 for comparing the first and second electrical signals to determine the ratio of their respective currents as a prerequisite to calculating instantaneous filament temperature. As reference above, film thickness and growth rate may thus be calculated according to the formulas $D=nP$ and $P=\lambda/2\eta$ where P is the film thickness corresponding to one period of interference fringe, $\lambda$ is the wavelength of the first or second optical bandwidths, $\eta$ is the index of refraction and n is the number of the period of interference frames. The growth rate (R) of the deposited film may also be calculated according to the formula $$R = \frac{D}{t}$$

where t=deposition time. In all cases, the film thickness and growth rate may be calculated without resort to an external light source.

In an alternative embodiment, detector system 26 further includes supplemental processing means 36 for generating a third electrical signal corresponding to the calculated filament temperature. Control means 38 is also provided in electrical contact with supplemental processing means 36 for adjusting power supply means 18 to achieve the desired chemical composition of the depositing gas.

OPERATION

Figure 3:
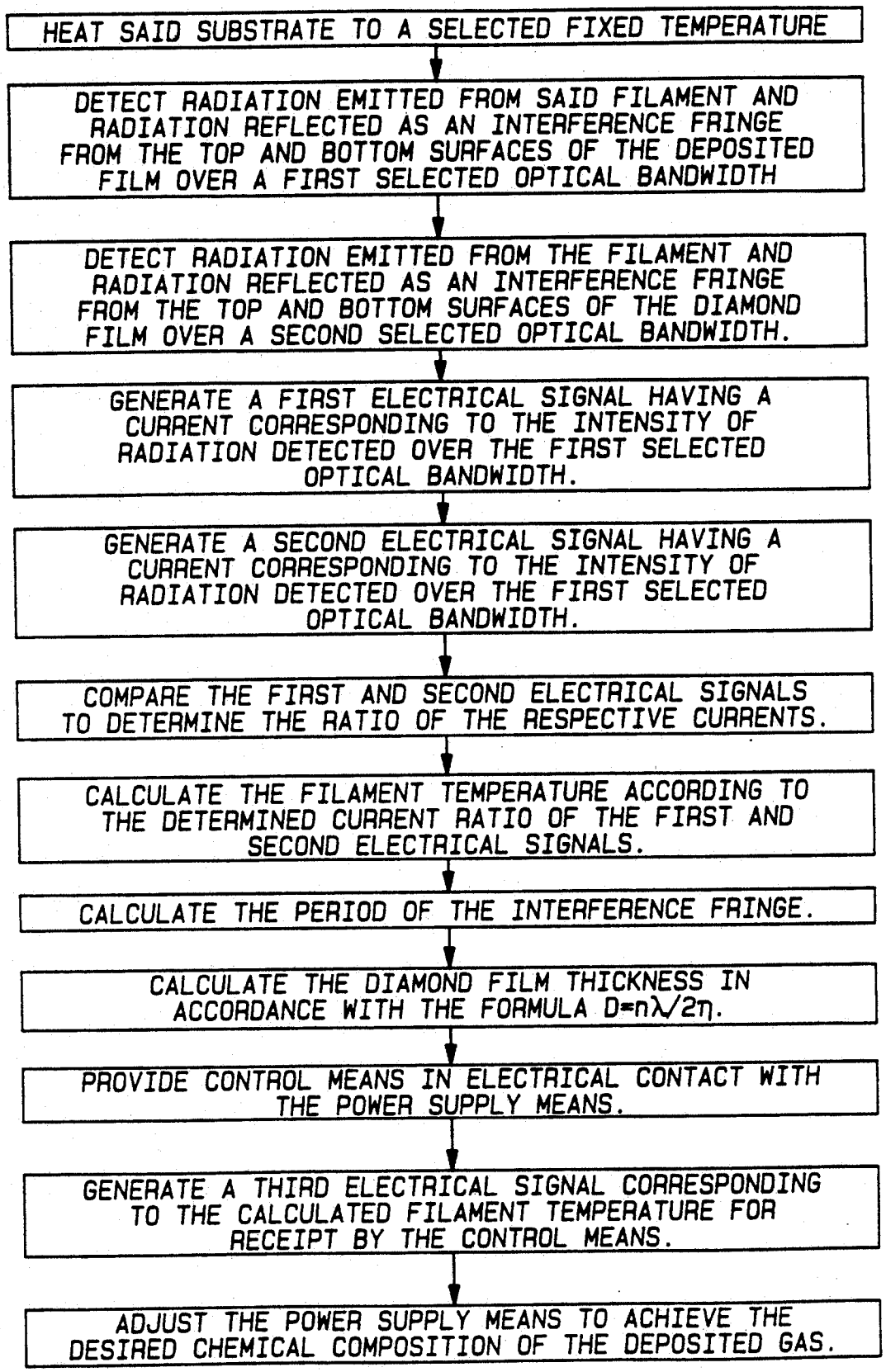
FIG. 3 is a block diagram of the method steps of the present invention.

With reference to FIG. 3, the method of Applicants' invention will now be described in further detail.

As referenced above, heating means 14 is provided in thermal contact with substrate 12 for maintaining the substrate at a selected fixed temperature. Thereafter, radiation emitted from filament 16 and radiation reflected as an interference fringe from the top and bottom surfaces of diamond film 40 is detected over a first selected optical bandwidth. Concurrently therewith, radiation emitted as white light directly from filament 16 and reflected as an interference fringe from the top and bottom surfaces of the diamond film is detected over a second selected optical bandwidth.

In response to the radiation detected over the first and second selected optical bandwidths, first and second electrical signals are generated, each having a current corresponding to the intensity of radiation detected over the corresponding selected optical bandwidth. The first and second electrical signals are compared to determine the ratio of the respective currents and the instantaneous filament temperature is thereafter calculated according to known mathematical principles. The period of interference fringe is also calculated and the film thickness (D) is determined in accordance with the formulas $$D=nP \text{ and } P=\lambda/2\eta$$

where P is the film thickness corresponding to one period of interference fringe and $\lambda$ is the wavelength of said first or second optical bandwidths. Significantly, for calculation purposes, Applicants have recognized that either bandwidth may be used. In fact, the operator may desire to use both for cross-reference purposes. $\eta$ is the index of refraction of the film material and n is the number of period. The growth rate of the deposited film (R) may also be calculated according to the formula $$R = \frac{D}{t}$$

where t=deposition time. In all cases, the film thickness and growth rate may be calculated without resort to an external light source.

In an alternative embodiment, where it is desired by the user to not only measure filament temperature but to feedback this information to control the chemical composition of the depositing gas, there is provided control means 38 in electrical contact with power supply means 18. A third electrical signal is thus generated corresponding to the calculated filament temperature for receipt by control means 38. Power supply means 18 is thereafter correspondingly adjusted to achieve the desired chemical composition of the depositing gas.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of the invention.

We claim:

1. Apparatus for in-situ measuring filament temperature and the thickness of a film deposited on a substrate disposed within a hot-filament chemical vapor deposition reactor, the apparatus comprising:

heating means positioned within said reactor for maintaining said substrate at a selected fixed temperature;

radiation detection means positioned within said reactor for detecting radiation emitted from said filament and radiation reflected as an interference fringe from said top and bottom surfaces of said film during operation of said reactor;

power supply means for regulating the temperature of said filament, said power supply means in electrical contact with said radiation detection means and said filament;

first signal generating means in electrical contact with said radiation detecting means for receiving radiation over a first selected optical bandwidth and generating a first electrical signal having a current corresponding to the intensity of said detected radiation;

second signal generating means in electrical contact with said radiation detection means for receiving radiation over a second selected optical bandwidth and generating a second electrical signal having a current corresponding to the intensity of said detected radiation; and signal processing means in electrical contact with said first and second signal generating means for receiving and processing said first and second electrical signals to mathematically calculate the instantaneous temperature of said filament and the thickness of said film without using an external light source.

2. An apparatus as in claim 1, wherein said signal processing means further comprises comparator means for comparing said first and second electrical signals to determine the ratio of their respective currents.

3. An apparatus as in claim 1, wherein said filament comprises a wire grid suspended substantially horizontally at a predetermined distance above said substrate.

4. An apparatus as in claim 1, wherein said radiation detection means comprises a lightpipe coupled to an optical thermometer.

5. An apparatus as in claim 1, wherein said first and second signal generating means are each adapted to convert radiation emitted as white light to monochromatic light.

6. An apparatus as in claim 1, wherein said first and second signal generating means each comprise a detector diode having an electrical filter sensitive to a selected optical wavelength.

7. An apparatus as in claim 5, wherein said electrical filters are operative at 800 nm and 950 nm, respectively.

8. An apparatus as in claim 4, wherein said lightpipe is positioned approximately 1 inch from said filament.

9. An apparatus as in claim 4, wherein said lightpipe is provided in optical contact with said optical thermometer by a fiber-optic cable.

10. An apparatus as in claim 3, wherein said filament is comprised of rhenium wire having a six-pass zig zag shape and a 0.006 inch diameter.

11. An apparatus as in claim 1, wherein said signal processing means comprises a microcontroller.

12. An apparatus as in claim 1, further comprising:
supplemental processing means in electrical contact with said signal processing means for generating a supplemental electrical signal corresponding to said calculated filament temperature; and
control means in electrical contact with said supplemental processing means and said power supply means for adjusting said power supply means to achieve the desired chemical composition of said depositing gas.

13. Apparatus for in-situ measuring filament temperature and the thickness of a diamond film deposited on a substrate disposed within a hot-filament chemical vapor deposition reactor, the apparatus comprising:
heating means for maintaining said substrate at a selected fixed temperature;
radiation detection means positioned within said reactor for detecting radiation emitted from said filament and radiation reflected as an interference fringe from said top and bottom surfaces of said diamond film during operation of said reactor;
power supply means for regulating the temperature of said filament, said power supply means in electrical contact with said radiation detection means and said filament; and
a pair of diode detectors in electrical contact with said radiation detection means, each of said diode detectors having a narrow band filter sensitive to a specific, but different optical bandwidth and producing an electrical output signal having a current corresponding to the intensity of said detected radiation over the corresponding optical bandwidth, wherein the instantaneous temperature of said filament and the thickness of said diamond film are mathematically calculated in accordance with the information provided by said output signals without using an external light source.

14. An apparatus as in claim 13, further comprising:
signal processing means in electrical contact with said detector diodes for generating a supplemental electrical signal corresponding to said calculated filament temperature; and
control means in electrical contact with said signal processing means and said power supply means for adjusting said power supply means to achieve the desired chemical composition of said depositing gas.

15. An apparatus as in claim 13, wherein said radiation detection means comprises a lightpipe sensor coupled to an optical thermometer.

16. An apparatus as in claim 13, wherein said band filters are operative at 800 nm and 950 nm, respectively.

17. An apparatus as in claim 14, wherein said lightpipe is positioned 1 inch from said filament.

18. An apparatus as in claim 13, wherein said filament is comprised of rhenium wire having a six-pass zig zag shape and a 0.006 inch diameter.

19. In a hot filament chemical vapor deposition reactor, a method of in-situ measuring filament temperature and the thickness of a film deposited on a substrate disposed therein, the method comprising the steps of:
heating said substrate to a selected fixed temperature;
detecting radiation emitted from said filament and radiation reflected as an interference fringe from said top and bottom surfaces of said film over a first selected optical bandwidth;
detecting radiation emitted from said filament and radiation reflected as an interference fringe from said top and bottom surfaces of said film over a second selected optical bandwidth;
generating a first electrical signal having a current corresponding to the intensity of said radiation detected over said first selected optical bandwidth;
generating a second electrical signal having a current corresponding to the intensity of said radiation detected over said second selected optical bandwidth;
comparing said first and second electrical signals to determine the ratio of their respective currents;
calculating said filament temperature according to said determined current ratio of said first and second electrical signals;
calculating the period of said interference fringe; and
calculating said film thickness (D) in accordance with the formula $$D = n\lambda/2\eta$$

where $\lambda$ = the wavelength of said first or second selected optical bandwidth, $\eta$ = the index of refraction of the film material and n = the number of the period of interference frames.

20. The method of claim 19, further including the step of calculating said film growth rate (R) according to the formula $$R = \frac{D}{t}$$

where t = deposition time.

21. The method of claim 19, further including the steps of:

providing control means in electrical contact with said power supply means;

generating a third electrical signal corresponding to said calculated filament temperature for receipt by said control means; and adjusting said power supply means to achieve the desired chemical composition of said depositing gas.

* * * * *

UNITED STATES PATENT AND TRADEMARK OFFICE
CERTIFICATE OF CORRECTION

PATENT NO. : 5,240,736
DATED : August 31, 1993
INVENTOR(S) : Ching-Hsong Wu et al It is certified that error appears in the above-identified patent and that said Letters Patent is hereby corrected as shown below:

Column 7, line 14, Claim 3, delete "i" and substitute --1--.

Signed and Sealed this

Fifteenth Day of March, 1994

Attest:

BRUCE LEHMAN

Attesting Officer     Commissioner of Patents and Trademarks